United States Patent [19]
Vreeland

[11] 3,961,224
[45] June 1, 1976

[54] TRANSIENT-FREE ISOLATION MONITOR

[75] Inventor: Robert W. Vreeland, San Francisco, Calif.

[73] Assignee: The Regents of the University of California, Berkeley, Calif.

[22] Filed: Jan. 30, 1975

[21] Appl. No.: 545,492

[52] U.S. Cl. .............................. 317/18 R; 324/51; 307/311
[51] Int. Cl.² ........................................ H02H 3/26
[58] Field of Search .................. 317/18 R; 340/255; 324/51; 307/269, 240, 311

[56] References Cited
UNITED STATES PATENTS

| | | | |
|---|---|---|---|
| 3,066,284 | 11/1962 | McKinley et al. | 317/18 R |
| 3,699,392 | 10/1972 | Lee et al. | 340/255 |

Primary Examiner—Gerald Goldberg
Assistant Examiner—Harry Moose
Attorney, Agent, or Firm—Flehr, Hohbach, Test, Albritton & Herbert

[57] ABSTRACT

Line isolation monitor utlizing photoisolators to effect switching without transients. Phase-lift networks are connected between the conductors of an isolated power system to provide samples to be monitored. A photoisolator comprising a light-emitting diode (LED) and a photoresistor is connected between each of the phase-shift networks and a current monitor, and the LEDs are energized alternately to apply the signals to the monitor. Timing circuits are included for preventing one photoisolator from being turned on while the other is still conducting.

5 Claims, 2 Drawing Figures

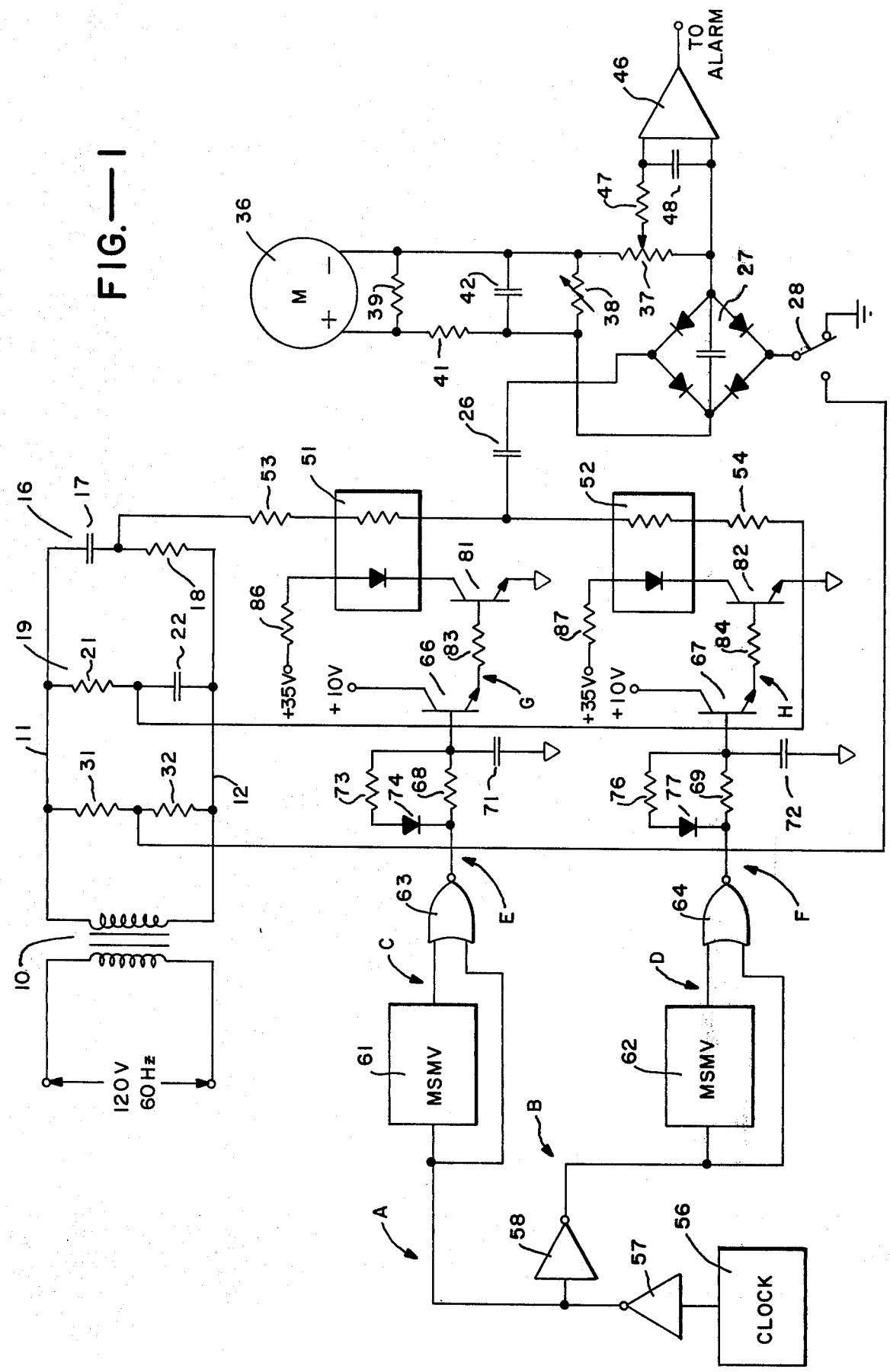
FIG.—1

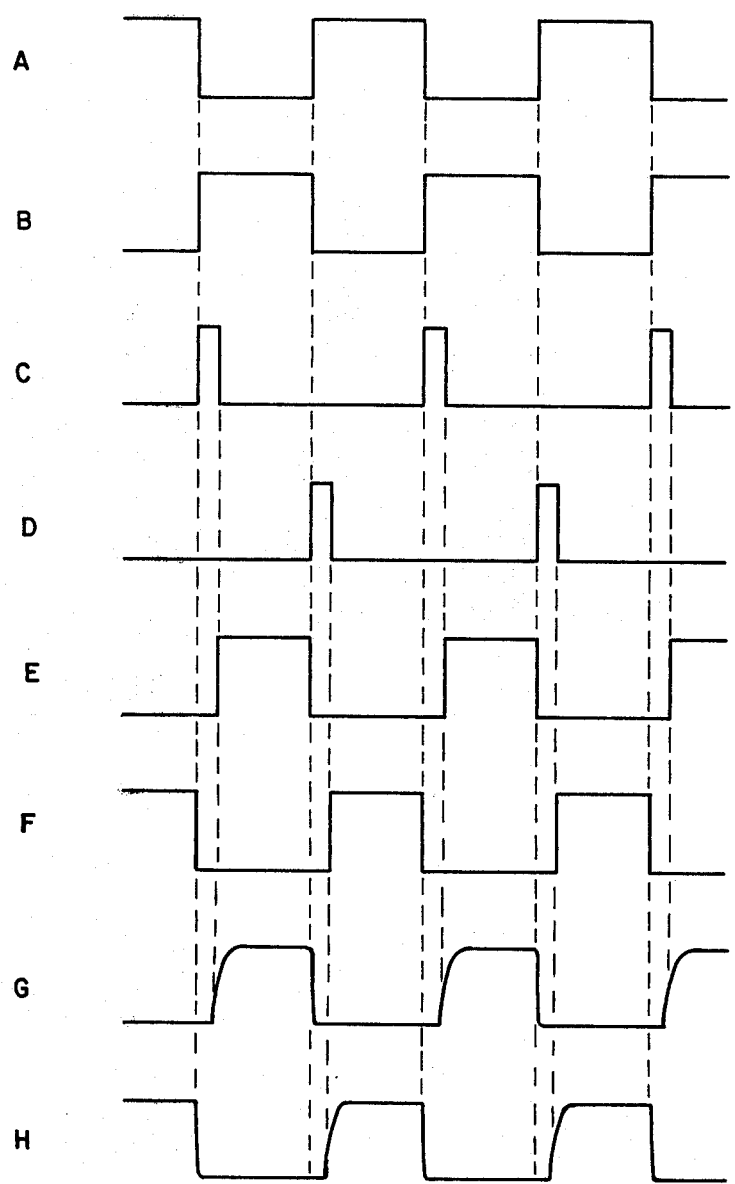
FIG. — 2

TRANSIENT-FREE ISOLATION MONITOR

BACKGROUND OF THE INVENTION

This invention pertains generally to electrical safety equipment and more particularly to line isolation monitors for detecting ground faults on power lines normally isolated from ground.

Isolated power systems have been used for many years in hospital operating rooms to reduce the danger of sparks to ground which might ignite the anesthetic used therein. Recently, so called safe power centers have been utilized in critical care areas and coronary care units. Generally, isolated power systems and safe power systems have isolation transformers which deliver AC power to conductors which are electrically isolated from the grounded power system which supplies the hospital. The isolated lines are commonly monitored to make certain that they remain isolated from ground.

Early isolation monitors, such as differential transformer systems, were not able to detect balanced faults existing simultaneously from both sides of the isolated power system to ground. More recently, sampling systems which alternately monitor the current between two points and ground have been used. While the sampling systems can detect balanced faults, they produce switching transients which interfere with the operation of various patient monitoring devices. The problem is particularly serious in the case of heart rate monitors since a line isolation monitor operating at the common sampling rate of 1.5 Hz produces transient spikes at the rate of 180 per minute, and this falls in the normal range of heart rate for a baby. The problem is so severe that hospital personnel have intentionally disabled line isolation monitors to prevent such interference.

Sampling line isolation monitors heretofore provided have generally utilized relays to perform the sampling. Attempts have been made without success to suppress the switching transients with capacitors, resistors, and diodes. It has been found that most of the transients can be eliminated by increasing the impedance of the monitor to reduce the current which is switched. However, this requires an amplifier or a more sensitive meter and recalibration of the system. Attempts to utilize zero-point switching have been unsuccessful due to the lack of a suitable phase reference.

SUMMARY AND OBJECTS OF THE INVENTION

The invention provides a line isolation monitor utilizing photoisolators to effect switching between samples without transients. Phase-shift networks are connected between the isolated conductors to provide the samples to the monitor. A photoisolator comprising a light emitting diode (LED) and a photoresistor is connected between each of the phase-shift networks and a current monitor, and the LEDs are energized alternately to apply the signals to the monitor. Timing circuits are included to prevent one photoisolator from being turned on while the other is still conducting.

It is in general an object of the invention to provide a new and improved line isolation monitor for detecting the existence of ground faults on isolated power lines.

Another object of the invention is to provide a line isolation monitor of the above character utilizing photoisolators to effect smooth transient free switching between samples to be monitored.

Another object of the invention is to provide a line isolation monitor of the above character having a timing circuit for preventing the photoisolators from conducting simultaneously.

Additional objects and features of the invention will be apparent from the following description in which the preferred embodiment is set forth in detail in conjunction with the accompanying drawings.

BRIEF DESCRIPTION OF THE DRAWINGS

FIG. 1 is a circuit diagram of one embodiment of a line isolation monitor according to the invention.

FIG. 2 is a graphical representation of wave-forms at certain points in the line isolation monitor of FIG. 1.

DESCRIPTION OF THE PREFERRED EMBODIMENT

In FIG. 1, the line isolation monitor is illustrated in connection with an isolated power system comprising an isolation transformer 10 and isolated conductors 11 and 12. The primary winding of the transformer is adapted for connection to a conventional 120 volt, 60 Hz power source, and conductors 11 and 12 are connected to the secondary winding of the transformer. Loads such as patient monitoring equipment are connected to the isolated conductors by conventional means, not shown. In the absence of ground faults, the isolated conductors will remain isolated from ground even though the power source connected to the primary winding is grounded. A first phase-shift network 16 consisting of a capacitor 17 and a resistor 18 and a second phase-shift network 19 consisting of a resistor 21 and a capacitor 22 are connected between conductors 11 and 12 to provide samples to be monitored. In the preferred embodiment, the capacitive reactance and the resistance are made equal at the line frequency so that the current in network 16 leads the current in conductor 11 by 45° and the current in network 19 leads the current in conductor 12 by 45°.

Means is provided for monitoring the sampled currents. This means includes an input capacitor 26 and a rectifier bridge 27. One input of the bridge is connected to capacitor 26, and the other input is connected to ground through a switch 28 when the switch is in the position illustrated. When the switch is in its other position, the second input of the bridge is connected to a point between conductors 11 and 12 by resistors 31 and 32. Thus, the switch provides means for testing the operation and calibration of the system.

The output of the rectifier bridge is applied to a current responsive meter by a series resistor 37, shunting resistors 38 and 39, and a resistor 41 and capacitor 42 which determine the time constant of the meter circuit. As illustrated, resistor 38 is variable and provides means for adjusting the sensitivity of the meter.

Means is also provided for giving an alarm in the event of a ground fault. This means includes an amplifier 46 which is connected generally in parallel with resistor 37. As illustrated, resistor 37 is a potentiometer, and one input of the amplifier is connected to the potentiometer by a resistor 47. The second amplifier input is connected directly to one output of rectifier bridge 27, and a capacitor 48 is connected between the inputs of the amplifier. Potentiometer 37 controls the sensitivity of the amplifier, and resistor 47 and capacitor 48 determine the time constant or response time of the amplifier. The output of the amplifier is connected to a suitable alarm, not shown.

The signals from phase-shift networks 16 and 19 are alternately applied to the monitoring circuit by photoisolators 51 and 52. Each of the photoisolators comprises a light emitting diode (LED) and a photoresistor having a resistance dependent upon the light impinging thereon. The photoresistors have a low resistance, e.g., 3500 ohms, when the LED is energized and a high resistance, e.g., 1 megohm to 100 megohms, when the LED is deenergized. Current limiting resistors 53 and 54 are connected in series with the photoresistors to prevent damage to the photoresistors in the event of a malfunction in the timing circuit which controls the operation of the photoisolators. In addition, resistors 53 and 54 determine the charging time constant of capacitor 42 and the magnitude of current passing through rectifier bridge 27.

Means is provided for applying control signals to the photoisolators to condition them to alternately apply the samples from the phase-shift networks to the monitoring circuit. This means includes a clock 56 which generates a generally rectangular clock signal having a frequency on the order of 0.5 Hz. The output of the clock is connected to the input of an inverter 57 and the output of this inverter is connected to the input of a second inverter 58. The output of inverter 57 is also connected to the input of a monostable or one-shot multivibrator 61, and the output of inverter 58 is connected to a monostable or one-shot multivibrator 62. The multivibrators have periods corresponding to the decay times of the photoresistors in the photoisolators, i.e., the time required for the resistance to reach a desired level after the LED is deenergized. In the preferred embodiment, the resistance of the photoisolators reaches a magnitude greater than 1 megohm approximately 100 milliseconds after the LED is deenergized, and the multivibrators are chosen to have periods on the order of 100 milliseconds. As discussed more fully hereinafter, this prevents one photoisolator from being turned on while the other is still conducting.

the outputs of multivibrators of 61 and 62 are connected to one input of NOR gates 63 and 64, respectively. Each of these gates also receives a second input from the output of the inverter associated therewith.

The outputs of NOR gates 63 and 64 are connected to the bases of transistors 66 and 67 by resistors 68 and 69, respectively. Capacitors 71 and 72 are connected between the bases of the transistors and an ungrounded floating common point. As discussed more fully hereinafter, resistors 68, 69 and capacitors 71, 72 form delay networks which increase the rise time of the control signals and assure smooth, transient-free turning on of the photoisolators. A resistor 73 and diode 74 are connected in parallel with resistor 68, and a resistor 76 and diode 77 are connected in parallel with resistor 69. The values of resistors 73 and 76 are smaller than the values of resistors 68 and 69 so that the decay of the control signals is faster than the rise.

The collectors of transistors 66 and 67 are connected to a suitable source of voltage, such as +10 volts, and the emitters are connected to the bases of transistors 81 and 82 by resistors 83 and 84, respectively. The emitters of transistors 81 and 82 are connected to the ungrounded common points, and the collectors are connected to the cathodes of the LEDs of photoisolators 51 and 52, respectively. The anodes of the LEDs are connected to a suitable source of voltage, such as +35 volts, by resistors 86 and 87.

Operation and use of the line isolation monitor can be described with reference to the waveforms illustrated in FIG. 2. It is assumed that the power source is energized and that switch 28 is in the position shown. During each cycle of the clock signal, inverters 57 and 58 produce the out-of-phase timing signals A and B illustrated in FIG. 2. Multi-vibrators 61 and 62 fire on the negative-going transitions of the timing signals, producing the delayed pulses of waveforms C and D. The signals at the outputs of NOR gates 63 and 64 are similar to the timing signals except their rise is delayed by an amount corresponding to the pulses from the multivibrators. The signals at the outputs of the NOR gates are illustrated by waveforms E and F in FIG. 2. The rise of the control signals is further delayed by the network consisting of resistor 68 and capacitor 71 and the network consisting of resistor 69 and capacitor 72, as illustrated in waveforms G and H. In the preferred embodiment, this additional delay is on the order of 30 milliseconds, making a total delay of 130 milliseconds. Rapid decay of the control signals is provided by resistor 73 and diode 74 and by resistor 76 and diode 77 which shunt resistors 68 and 69 to discharge capacitors 71 and 72, respectively.

When the control signal G is high, transistor 81 is turned on, the LED of photoisolator 51 is energized, and the signal from phase-shift network 16 is applied to the metering circuit. At this time, control signal H is low, transistor 82 is turned off, and photoisolator 52 is turned off. Approximately 130 milliseconds after control signal G returns to its low level, control signal H reaches its high level, and photoisolator 52 is turned on, applying the signal from phase-shift network 19 to the monitoring circuit. In the event of a ground fault on either or both of the isolated conductors, meter 36 will indicate the fault current, and the alarm will be actuated.

The system can be tested for proper operation by placing switch 28 in its other position whereby the reference for the monitoring circuit is a point between the isolated conductors, rather than ground.

The invention has a number of important features and advantages. It can detect ground faults on either or both of the conductors of an isolative power system, and it is free of the switching transients which have been produced by the sampling line isolation monitors of the prior art. In addition, it can be readily incorporated in existing equipment.

It is apparent from the foregoing that a new and improved line isolation monitor has been provided. While only the preferred embodiment has been described, as will be apparent to those familiar with the art, certain changes and modifications can be made without departing from the scope of the invention as defined by the following claims.

I claim:

1. In a line isolation monitor for detecting the existence of ground faults on power conductors normally isolated from ground: first and second phase-shift networks connected between the conductors for providing first and second signals to be monitored, signal monitoring means responsive to a current flowing between the input of the monitoring means and ground, a first photoisolator connected between the first phase-shift network and the input of the monitoring means, a second photoisolator connected between the second phase-shift network and the input of the monitoring means, means for providing first and second generally rectangular timing signals of predetermined frequency and opposite phase, means including a delay network responsive to the timing signals for delivering generally rectangular control signals which rise gradually from a first level to a second level a predetermined time after a transistion of predetermined polarity in the timing signals, and means for applying the generally rectangular control signals to the photoisolators to alternately condition the photoisolators to pass the first and second signals to the monitoring means, the photoisolators being conditioned to pass the first and second signals to the indicator means when the respective control signals are at the second level.

2. The line isolation monitor of claim 1 wherein each of the photoisolators comprises a light emitting element and a light sensitive element having a resistance dependent on the amount of light impinging thereon.

3. In a line isolation monitor for detecting the existence of ground faults on power conductors normally isolated from ground: first and second phase-shift networks connected between the conductors for providing first and second signals to be monitored, signal monitoring means responsive to a current flowing between the input of the monitoring means and ground, a first photoisolator connected between the first phase-shift network and the input of the monitoring means, a second photoisolator connected between the second phase-shift network and the input of the monitoring means, means for providing first and second generally rectangular timing signals of predetermined frequency and opposite phase, means responsive to the timing signals for delivering generally rectangular control signals which rise from a first level to a second level a predetermined time after a transistion of predetermined polarity in the timing signals, and means for applying the generally rectangular control signals to the photoisolators to alternately condition the photoisolators to pass the first and second signals to the monitoring means, the means for delivering generally rectangular control signals comprising for each of the photoisolators: a one-shot multivibrator having a period corresponding to the predetermined time, a NOR gate having one input connected to the output of the multivibrator, and means for applying one of the timing signals to a second input of the NOR gate and to the input of the multivibrator.

4. In a line isolation monitor for detecting the existence of a ground fault on power conductors normally isolated from ground: ground fault detector means, first and second photoisolators connected between the conductors and the ground fault detector means, each of said photoisolators having a conductivity determined by the level of a control signal applied thereto, and means for applying cyclical control signals of predetermined non-instantaneous rise time to the photoisolators for alternately increasing the conductivities thereof in a predetermined gradual manner.

5. The line isolation monitor of claim 4 wherein the means for applying control signals includes means for delaying the rise of the control signal applied to the first photoisolator until a predetermined time after the control signal applied to the second photoisolator drops to a predetermined level.

* * * * *